United States Patent [19]

Chang et al.

[11] 4,026,741
[45] May 31, 1977

[54] TECHNIQUE FOR PREPARATION OF STOICHIOMETRIC III–V COMPOUND SEMICONDUCTOR SURFACES

[75] Inventors: Chuan Chung Chang, Berkeley Heights; Paul H. Citrin; Bertram Schwartz, both of Westfield, all of N.J.

[73] Assignee: Bell Telephone Laboratories, Incorporated, Murray Hill, N.J.

[22] Filed: June 16, 1976

[21] Appl. No.: 696,563

[52] U.S. Cl. .............................. 156/628; 156/650; 156/656; 204/56 R; 252/79.5
[51] Int. Cl.² .................. B29C 17/08; C25D 11/00
[58] Field of Search .......... 204/32 S, 56 R, 129.43, 204/141.5; 156/7, 17; 252/79.5; 29/580; 427/93

[56] References Cited

UNITED STATES PATENTS

| 3,798,139 | 3/1974 | Schwartz | 204/56 R |
| 3,898,141 | 8/1975 | Ermanis et al. | 156/17 X |

*Primary Examiner*—William A. Powell
*Attorney, Agent, or Firm*—Edward M. Fink

[57] ABSTRACT

A technique for preparing stoichiometric group III–V compound semiconductor surfaces involves a repetitive anodizing and etching sequence in an aqueous solution of appropriate pH and a basic solution, respectively. Surfaces treated in the described manner evidence a correct surface stoichiometry and minimum carbon contamination.

6 Claims, 1 Drawing Figure

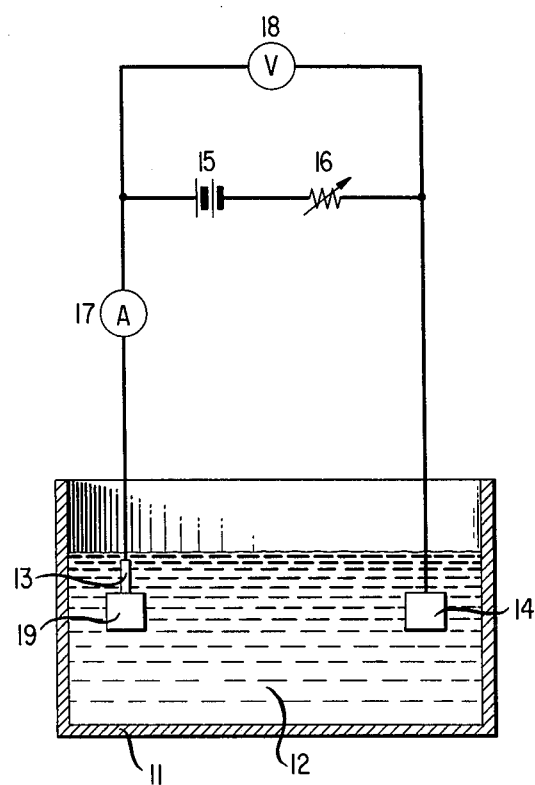

TECHNIQUE FOR PREPARATION OF STOICHIOMETRIC III–V COMPOUND SEMICONDUCTOR SURFACES

This invention relates to a technique for preparing group III–V compound semiconductor surfaces. More particularly, the present invention relates to a technique for preparing clean, stoichiometric group III–V compound semiconductor surfaces.

Heretofore, in the preparation of compound semiconductor surfaces, it has been common practice to employ a simple final etching step, a bromine-methanol, solution typically being used for this purpose. Although it has been theorized that the foregoing etching technique effects removal of nonstoichiometric surface layers, analysis of etched surfaces has often revealed that such is not the case. In fact, nonstoichiometric surfaces which are highly contaminated with carbon often result, so prompting workers in the art to seek alternate techniques for overcoming these limitations.

In accordance with the present invention, this end is attained by a novel processing sequence involving repetitive anodization and etching. Briefly, the inventive technique involves anodizing a surface of a group III–V compound semiconductor in a dilute aqueous solution having a pH ranging from 1.5 to 8, so resulting in the formation of an oxide layer which is subsequently etched away. The procedure is then repeated at lower anodization voltages and shorter etching times to yield a stoichiometric surface evidencing minimum carbon contamination.

The invention will be more readily understood by reference to the following detailed description taken in conjunction with the accompanying drawing wherein:

The FIGURE is a schematic representation of an anodization system used in the practice of the present invention.

With reference more particularly to the FIGURE, there is shown a typical system suitable for use in anodizing compound semiconductors. Shown in the FIGURE is container 11 having disposed thereon electrolyte 12, anode 13 and cathode 14. The anodization system is electrically completed by means of direct current source 15 and variable resistor 16 which function as a constant voltage or constant current source. Ammeter 17 and voltmeter 18 are included in the circuit for measuring current and applied potential respectively.

In the operation of the process, any of the group III–V compound semiconductors may be employed, such semiconductors being obtained from commercial sources or grown by epitaxial growth techniques, gallium arsenide, gallium phosphide, gallium antimonide and ternary compounds thereof containing aluminum or indium being found particularly suitable. The semiconductor compound 19 may be attached to anode 13 in the FIGURE and immersed in electrolyte 12 together with cathode 14 which may be a noble metal, typically platinum. Electrolytes suitable for use herein may be selected from among aqueous solutions having a pH adjusted to a value within the range of from 1.5–8. This end may be effected by employing water as the electrolyte, the pH of which is adjusted to a desired value by means of phosphoric acid, ammonium acid phosphates, hydrogen peroxide and the like.

Initially a bias is applied to the semiconductor in an amount of at least 50 volts beyond the working voltage which is defined as the difference of voltage across the semiconductor-solution interface. Growth of an oxide layer is continued for a time period sufficient to yield an oxide film across the entire surface of the semiconductor. Growth typically occurs at a rate ranging from 10–30 Angstroms per volt for the group III–V semiconductors. The thickness of the film grown in this stage of the processing should range from 500–3000 Angstroms, a 1000 Angstroms thick layer being typical. The anodization step results in the cleansing of the surface of the semiconductor and the delineation of a uniform surface. Following, the anodized structure is removed from the anodizing medium and immersed in an aqueous solution of a base having a pH of the order of 8–13.5. Etching is continued for a time period within the range of 30–120 seconds for the purpose of effecting the removal of the grown oxide film. Bases suitable for this purpose are the hydroxides of potassium, sodium, ammonium and the like. A general preference exists for ammonium hydroxide since it eliminates the possibility of alkali metal contamination on the semiconductor surface.

Next, the compound semiconductor is removed from the etching bath and returned to the anodization system. Then, anodization is again effected at an anodization voltage of approximately 5–10 volts (the working voltage) for a time period sufficient to yield an oxide layer of the order of 100–200 Angstroms in thickness. Finally, stripping of the oxide is again effected in the aqueous solution of ammonium hydroxide, immersion being continued for a time period sufficient to remove only the grown oxide and not to effect etching of the substrate, typically from 5–10 seconds. The resultant surface is found to be essentially stoichiometric in that the ratio of compound III to compound V elements is approximately 1:1. Additionally, carbon contamination is found to be negligible in the treated surface.

An example of the present invention is set forth below. It will be understood that the exemplary embodiment is for purposes of exposition only and is not to be construed as limiting.

EXAMPLE

The semiconductor material selected was a slice of n-type selenium doped GaAs having a carrier concentration of approximately $1 \times 10^{18}/cm^{-3}$. The semiconductor sample had been prepolished in a bromine-methanol solution also attached to anode 13 in a system of the type depicted in the FIGURE and immersed in an aqueous electrolyte having a pH of 2.5, adjustment to that value being made with phosphoric acid. A bias of 50 volts was applied to the semiconductor for 20 seconds, so resulting in an oxide film 3000 Angstroms in thickness. Then the semiconductor was removed from the anodizing medium and etched in a 1:1 $H_2O$-$NH_4OH$ solution for approximately one minute, so resulting in removal of the oxide. Then the semiconductor surface was reanodized in the $H_2O$-$H_3PO_4$ medium at ten volts for a time period sufficient to yield an oxide layer having a thickness of about 200 Angstroms. Next, the GaAs was immersed in the 1:1 $H_2O$-$NH_4OH$ solution and etched for 5–10 seconds. The resultant GaAs surface evidenced a gallium to arsenic ration of approximately 1:1.

For comparative purposes the procedure was repeated in the absence of the second anodization etching step and then both examples repeated with varying parameters. Data obtained is set forth below in the Table.

| Sample | First Anodization/Etch Angstrom | Voltage | Etchant | Second Anodization/Etch Angstrom | Voltage | Etchant | Atom % C Contamination in Surface 8 Angstroms | Average Arsenic to Gallium Ratio in Surface 15 Angstroms |
|---|---|---|---|---|---|---|---|---|
| 1 | — | — | HCl | — | — | — | 75 | 1.30 ± 0.10 |
| 2 | 2000 | 100 | HCl | — | — | — | 60 | 1.30 ± 0.10 |
| 3 | 3000 | 150 | HCl | — | — | — | 50 | 1.30 ± 0.10 |
| 4 | — | — | NH$_4$OH | — | — | — | 30 | 1.13 ± 0.10 |
| 5 | 2000 | 100 | NH$_4$OH | — | — | — | 27 | 1.04 ± 0.10 |
| 6 | 3000 | 150 | NH$_4$OH | — | — | — | 8 | 1.10 ± 0.10 |
| 7 | 3000 | 150 | NH$_4$OH | 100 | 5 | NH$_4$OH | 8 | 1.00 ± 0.10 |
| 8 | 3000 | 150 | NH$_4$OH | 200 | 10 | NH$_4$OH | 8 | 1.00 ± 0.10 |

It is apparent from a review of the data that the second anodization/etch step results not only in an enhancement in stoichiometry of the surface of the compound semiconductor but also in reduction of the carbon contamination at the surface.

What is claimed is:

1. Technique for preparing stoichiometric Group III–V compound semiconductor surfaces which comprises the steps of
    a. anodizing a group III–V compound semiconductor in an aqueous electrolyte having a pH within the range of 1.5–8 at an anodizing voltage within the range of 50–175 volts for a time period sufficient to yield an oxide film of approximately 1000 Angstroms,
    b. etching off the oxide film with a basic etchant, having a pH from 8–13.5,
    c. reanodizing the resultant assembly at an anodizing voltage within the range of 5–10 volts for a time period sufficient to yield a second oxide film ranging up to 200 Angstroms, and
    d. stripping the second oxide film with a basic etchant having a pH from 8–13.5 by immersion in the etchant for a time period sufficient to remove only the grown second oxide film.

2. Technique in accordance with claim 1 wherein the aqueous electrolyte is phosphoric acid.

3. Technique in accordance with claim 1 wherein the aqueous electrolyte is ammonium acid phosphide.

4. Technique in accordance with claim 1 wherein the etchant is ammonium hydroxide.

5. Technique in accordance with claim 2 wherein the etchant is ammonium hydroxide.

6. Technique in accordance with claim 5 wherein the compound semiconductor is gallium phosphide.

* * * * *